United States Patent [19]

Voorman et al.

[11] Patent Number: 4,853,651
[45] Date of Patent: Aug. 1, 1989

[54] DELAY CIRCUIT WITH ALL-PASS NETWORK

[75] Inventors: Johannes O. Voorman; Pieter J. Snijder; Johannes S. Vromans, all of Eindhoven, Netherlands

[73] Assignee: U.S. Philips Corp., New York, N.Y.

[21] Appl. No.: 94,471

[22] Filed: Sep. 8, 1987

[30] Foreign Application Priority Data

Sep. 15, 1986 [NL] Netherlands ............... 8602329

[51] Int. Cl.[4] ............................................. H03F 1/34
[52] U.S. Cl. ...................................... 330/294; 330/107
[58] Field of Search ................. 330/107, 294; 333/18

[56] References Cited

U.S. PATENT DOCUMENTS 4,745,622 5/1988 Gupta .................................. 330/294

Primary Examiner—Gene Wan
Attorney, Agent, or Firm—Steven R. Biren

[57] ABSTRACT

A third-order all-pass network for a delay circuit is formed by four coupled transconductors ($G_{10}$ to $G_{13}$) which are each represented by two transistors whose bases constitute the inputs and whose collectors constitute the outputs of the transconductor. A first input of these transconductors ($G_{10}$ to $G_{13}$) is connected to ground (3). Between the second inputs (25,26) of the first transconductor ($G_{10}$) and the second transconductor ($G_{11}$) a first capacitor ($C_1$) is arranged, while between the second imputs (26,27) of the second transconductor ($G_{11}$) and the third transconductor ($G_{12}$) a second capacitor ($C_2$) is arranged, and between the second inputs (27,28) of the third transconductor ($G_{12}$) and the fourth transconductor ($G_{13}$) a third capacitor ($C_3$) is arranged. Further, a fourth capacitor ($C_4$) is arranged between the second inputs (25,27) of the first transconductor ($G_{10}$) and the third transconductor ($G_{12}$), a fifth capacitor ($C_5$) is arranged between the second inputs (26,28) of the second transconductor ($G_{11}$) and the fourth transconductor ($G_{13}$), and a sixth capacitor ($C_6$) is arranged between the second inputs (25,28) of the first transconductor ($G_{10}$) and the fourth transconductor ($G_{13}$). The third ($C_3$), fourth ($C_4$) and sixth ($C_6$) capacitors reduce resonance tendencies of the circuit and consequent resonant rise symptoms as a result of parasitic effects.

4 Claims, 12 Drawing Sheets

DELAY CIRCUIT WITH ALL-PASS NETWORK

BACKGROUND OF THE INVENTION

The invention relates to a delay circuit comprising at least one all-pass network which has an input terminal for receiving an input signal, an output terminal for supplying an output signal, and a reference terminal for carrying a reference potential and which comprises an at least second-order filter section comprising three transconductors, which each have a first input, a second input, a first output and a second output, the first input of each of the three transconductors being coupled to the reference terminal, the second input of the first transconductor being coupled to the input terminal, the second input of the second transconductor being coupled to the second output of the first transconductor and to the first output of the third transconductor, the second input of the third transconductor being coupled to the second output of the second transconductor and to the output terminal, which filter section further comprises a first capacitor arranged between the second inputs of the first transconductor and the second transconductor, and a second capacitor arranged between the inputs of the first transconductor and the third transconductor.

Such a delay circuit may be employed for envelope-delay correction of filters, as a delay line whose delay may be variable or not, and in adaptive filters.

Such a circuit arrangement is known from the article "Integration of Analog Filters in a Bipolar Process" IEEE Jnl. of Solid State Circuits, Vol. SC-17, No. 4, August 1982, pp. 713–722. A transconductor is a voltage-controlled current source in which the proportionality factor between the output current and the input voltage is given by the transconductance. By means of a transconductor it is possible to simulate a resistor, while two coupled transconductors may be arranged to form a gyrator by means of which a capacitor and an inductor can be simulated. This means that using transconductors and capacitors it is possible to realize all filter circuits which can also be manufactured by means of conventional coils, capacitors and resistors. From the above article it is also known that all-pass networks can be formed by means of transconductors and capacitors. FIG. 15 in the above article shows a first-order network and a second-order network comprising these elements. The transconductors have one input connected to ground and all the capacitors are floating. For the delay of signals of comparatively large bandwidth at least second-order all-pass networks are required in order to maintain deviations from the desired delay time comparatively small over the entire bandwidth. A drawback of such second-order all-pass networks is that parasitic effects, for example, as the result of stray capacitances, may show resonance effects. The gain of the all-pass network is then not equal to unity over the entire bandwidth of the signal and comparatively large frequency-dependent deviations from the desired delay occur.

SUMMARY OF THE INVENTION

Therefore, it is the object of the present invention to provide a delay circuit provided with at least one all-pass network in which the parasitic effects show less resonance effects. According to the invention a delay circuit of the type defined above is characterized in that the filter section comprises a third capacitor which is arranged between the second inputs of the second transconductor and the third transconductor. This third capacitor reduces the resonant effects, so that it is possible to maintain unity gain over the entire bandwidth of the signal to be delayed and deviations from the desired delay are minimized.

An embodiment of the invention may be characterized in that the all-pass network further comprises a first-order filter section which together with the second-order filter section constitutes a third-order filter section, which first-order filter section comprises a fourth transconductor having a first input and a second input and a first output and a second output, and a fourth capacitor. By constructing the all-pass networks as third-order networks deviations from the desired delay can be reduced relative to those occurring in second-order networks. This embodiment permits the likelihood of the occurrence of the resonance effects to be reduced even further if it is characterized further in that the fourth transconductor has its first input coupled to the reference terminal, its second input to the second output of the third transconductor, its first output to the second input of the third transconductor, and its second output to the output terminal of the network, in that the fourth capacitor is arranged between the second inputs of the third transconductor and the fourth transconductor, and in that the third-order filter section further comprises a fifth capacitor which is arranged between the second inputs of the second transconductor and the fourth transconductor and, optionally, a sixth capacitor which is arranged between the second inputs of the first transconductor and the fourth transconductor.

Deviations from the desired delay can also be reduced if the all-pass network does not comprise one but a cascade of at least two second-order filter sections, the third transconductor of the first section and the first transconductor of the second section being commoned to form a single transconductor.

If the delay circuit in accordance with the invention comprises a plurality of cascaded all-pass networks it may be characterized, in accordance with an further embodiment, in that every transconductor of an all-pass network which is connected to an output terminal and the transconductor of a subsequent all-pass network which is connected to the input terminal are commoned to form a single transconductor. A further embodiment of the invention may be characterized in that the first output of the transconductor of the first all-pass network which is connected to the input terminal is connected to the reference terminal. Yet another embodiment may be characterized in that the output terminal of the last all-pass network of the delay circuit is connected to the second output of the transconductor connected to the output terminal.

In the delay circuit in accordance with a further embodiment of the invention each of the transconductors may comprise a linearized differential amplifier comprising at least two emitter-coupled transistors with a bias-current source, the bases of the transistors constituting the first input and the second input and the collectors constituting the first output and the second output. The first output and the second output of each transconductor may then be loaded by a current source.

In the delay circuits described in the foregoing one of the inputs of the transconductors of the all-pass network is connected to ground and the signal current is taken from both outputs of the transconductors. An analysis of these circuits has revealed that the circuits operate in the same way if both inputs of the transconductor are floating and signal current is taken from only one of the outputs. In that case a delay circuit comprising at least one all-pass network having an input terminal for receiving an input signal, an output terminal for supplying an output signal, and a reference terminal for carrying a reference potential, and comprising an at least second-order filter section which comprises three transconductors, which each have a first input, a second input, a first output and a second output, and a first and a second capacitor, may be characterized in that the first input of the first transconductor is coupled to the input terminal, the first input of the second transconductor is coupled to the first output of the first transconductor, the first output of the second transconductor is coupled both to the second input of the first transconductor and to the first input of the third transconductor, and the second input of the second transconductor is coupled to the first output of the third transconductor, in that the first capacitor is arranged between the first output of the first transconductor and that of the second transconductor and the second capacitor is arranged between the first output of the first transconductor and that of the third transconductor, and in that a third capacitor is arranged between the first output of the second transconductor and that of the third transconductor. In this embodiment the presence of the third capacitor also reduces the likelihood that resonance effects occur.

When the delay circuit is thus constructed each all-pass network may comprise a first-order filter section which together with the second-order filter section constitutes a third-order filter section, which first-order filter section comprises a fourth transconductor having a first input, a second input, a first output and a second output, and a fourth capacitor. In this delay circuit the likelihood that resonance effects occur may also be further reduced if the delay circuit is characterized in that the fourth transconductor has its first input coupled to the first output of the third transconductor and its first output to the second input of the third transconductor, in that the fourth capacitor is arranged between the first output of the third transconductor and that of the fourth transconductor, and in that the third-order section comprises a fifth capacitor arranged between the first output of the second transconductor and that of the fourth transconductor, and a sixth capacitor which is arranged between the first output of the first transconductor and that of the fourth transconductor.

In yet another embodiment each all-pass network may comprise a cascade of at least two second-order filter sections, the third transconductor of the first section and the first transconductor of the second section being commoned to form a single transducer.

If the delay circuit comprises a plurality of cascaded networks, in accordance with a further embodiment, the transconductor of a network which is connected to the output terminal and the transconductor of a subsequent network which connected to the input terminal may be commoned to form a single transconductor.

In such delay circuits, in a further embodiment, each of the transconductors may comprise a linearized differential amplifier comprising at least two emitter-coupled transistors with a bias-current source, the bases of the transistors constituting the first input and the second input and the collectors constituting the first output and the second output. Said first output and second output of each transconductor may be coupled to each other by means of a current mirror or a negative immittance converter.

BRIEF DESCRIPTION OF THE DRAWINGS

Embodiments of the invention will now be described in more detail, by way of example, with reference to the accompanying drawings, in which:

FIG. 12 shows the circuit of FIG. 9c comprising transconductors as shown in FIG. 11a.

DESCRIPTION OF THE PREFERRED EMBODIMENTS

Figure 1A:
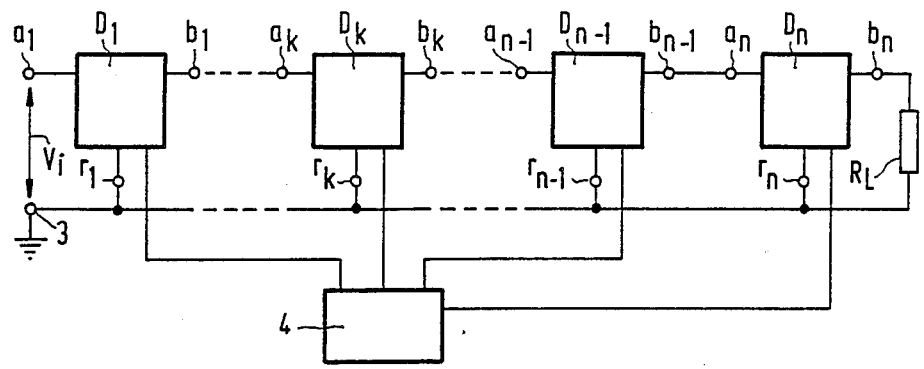
FIG. 1a is a basic diagram of a delay line comprising a delay circuit.

FIG. 1a is the basic diagram of a delay line for which the delay circuit in accordance with the invention can be used. The delay line comprises a plurality of all-pass networks $D_1, \ldots, D_n$ arranged in cascade. In this respect an all-pass network is to be understood to mean a network whose gain is substantially constant and equal to unity over a specific bandwidth. Each network $D_k(k=1, \ldots, n)$ has an input terminal $a_k$, an output terminal $b_k$ and a reference terminal $r_k$. The reference terminal $r_k$ of each network is connected to ground terminal 3. The input terminal $a_k$ of each network $D_k$ is connected to the output terminal $b_{k-1}$ of the preceding network $D_{k-1}$, except for the input terminal $a_1$ of the first network $D_1$, which constitutes the input terminal of the delay line and which receives the input voltage $V_i$. The delayed input voltage $V_o$ appears across a load resistor $R_L$ arranged between the output terminal $b_n$ of the last network $D_n$ and the ground terminal 3. The delay time of each of the networks $D_k$ may be fixed, but it is also possible to make the delay time variable by connecting a control input of each of the networks to a control circuit 4.

Figure 1B:
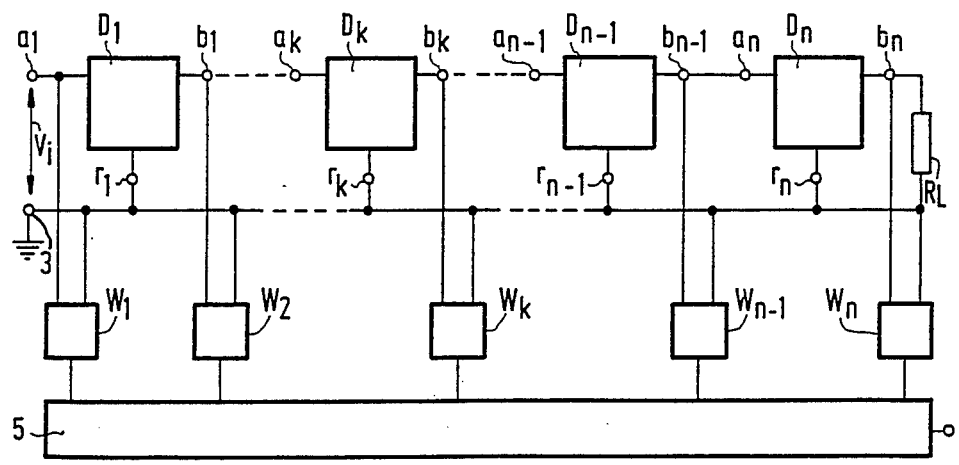
FIG. 1b a basic diagram of a transversal filter comprising a delay circuit.

FIG. 1b shows the basic diagram of a transversal filter in which the delay circuit in accordance with the invention may be employed. Identical parts bear the same reference numerals as in FIG. 1a. In such a filter the input signal $V_i$ and the signals delayed by the networks $D_k$ are multiplied by a weighting factor in weighting means $W_k$ (k=0, 1, ..., n) and are subsequently added to each other in a summing device 5. On the output of this device this yields an output signal which is a filtered replica of the input signal $V_i$. An adaptive filter can be obtained by making the weighting factors variable.

Figure 2A:
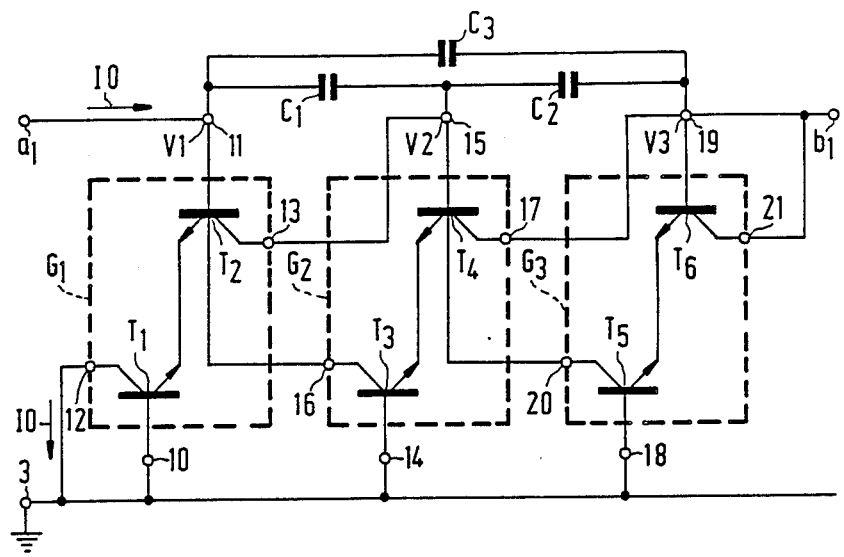
FIG. 2a shows a delay circuit in accordance with a first embodiment of the invention, comprising a second-order all-pass network.
Figure 2B:
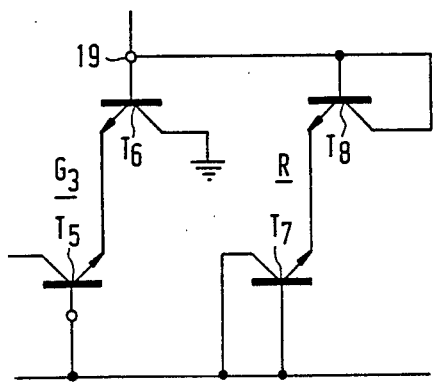
FIG. 2b is a diagram to explain the structure of the circuit shown in FIG. 2a, FIG. 3a shows a delay circuit in accordance with the invention comprising two cascaded second-order networks as shown in FIG. 2a, FIG. 3b is a diagram to explain the structure of the circuit shown in FIG. 3a, FIG. 4 shows a delay circuit in accordance with the invention comprising a first type of third-order all-pass network.

FIG. 2a shows an example of an all-pass network for a delay circuit in accordance with the invention, which network comprises a second-order filter section. For the sake of simplicity the Figure only shows the signal paths of the circuit and bias-current sources and the like are not shown. The second-order filter section comprises three identical transconductors $G_1$, $G_2$ and $G_3$, which are shown in their simplest form, namely a differential amplifier comprising two emitter-coupled transistors, whose bases constitute the inputs and whose collectors constitute the outputs of the transconductor. The first transconductor $G_1$ comprises the transistors $T_1$ and $T_2$, the base of the transistor $T_1$ constituting the first input 10, which is connected to the ground terminal 3, and the base of the transistor $T_2$ constituting the second input 11, which is connected to the input terminal $a_1$ of the network to which the input signal is applied. The collector of the transistor $T_1$ constitutes the first output 12 and the collector of the transistor $T_2$ constitutes the second output 13 of the transconductor $G_1$. The second transconductor $G_2$ comprises the transistors $T_3$ and $T_4$, the transistor $T_3$ having its base 14 connected to the ground terminal 3 and its collector 16 to the base of the transistor $T_2$ and the transistor $T_4$ having its base 15 connected to the collector 13 of the transistor $T_2$. The third transconductor $G_3$ comprises the transistors $T_5$ and $T_6$, the transistor $T_5$ having its base 18 connected to the ground terminal 3 and its collector 20 to the base of the transistor $T_4$ and the transistor $T_6$ having its base 19 connected to the collector 17 of the transistor $T_4$ and to the output terminal $b_1$ of the network. Further, the all-pass network comprises a first capacitor $C_1$ arranged between the bases 11 and 15 of the transistors $T_2$ and $T_4$, and a second capacitor $C_3$ arranged between the bases 11 and 19 of the transistors $T_2$ and $T_6$. The network further comprises a third capacitor $C_2$ which is arranged between the bases 15 and 19 of the transistors $T_4$ and $T_6$. The addition of the capacitor $C_2$ to the second-order network reduces resonance effects in the network because resonant-rise symptoms caused by parasitic effects, for example as a result of stray capacitances, are reduced. These parasitic effects inter alia produce a rise in gain, so that the amplitude characteristic of the network is not as flat as possible and is not substantially equal to unity within the desired frequency range. A voltage VI is applied to the input terminal $a_1$ in order to determine the transfer characteristic of the network. The collector 12 of the transistor $T_1$ is then connected to the ground terminal 3. Further, the network is loaded by a load resistance, for which purpose the collector 21 of the transistor $T_6$ is connected to its base 19. By means of FIG. 2b it will be demonstrated that by making this connection the network is loaded by a resistance. This Figure only shows the last transconductor of the network. The collector of the transistor $T_6$ is connected to the ground terminal 3. A resistance R between the output terminal $b_1$ and terminal 3 is constituted by a transconductor which is identical to the transconductor $G_3$ and which comprises the transistors $T_7$ and $T_8$ whose bases are connected to their collectors. Since the bases of the transistors $T_6$ and $T_8$ are at the same voltage, the current through the resistance R will be the same as that through the transconductor $G_3$. The current through the resistance R is drained to terminal 3, because the collector of the transistor $T_7$ is connected to terminal 3. The transistor $T_6$ only supplies current to the transistor $T_5$, because the collector of the transistor $T_6$ is connected to terminal 3. Since the collector currents of the transistors $T_6$ and $T_7$ do not serve any useful purpose, these transistors may be dispensed with. The emitter of the transistor $T_8$ should then be connected to the emitter of the transistor $T_5$. This results in the configuration shown in FIG. 2a.

When the voltage VI is applied, an input current IO will flow through the input terminal $a_1$, which current is entirely drained to ground via the collector 12 of the transistor $T_1$. This means that this current is equal to IO=GVI, where G is the transconductance of the transconductor $G_1$. Consequently, the input impedance of the network is equal to 1/G. As this is a pure resistance, the networks may be coupled directly to one another. If the voltages on the inputs 15 and 19 are V2 and V3, respectively and the base currents of the transistors $T_4$ and $T_6$ are ignored, the sum of the currents through the inputs 15 and 19 is equal to:

$$-GV1+GV3+(V1-V2)pC1+(V3-V2)pC2=0 \quad (1)$$

$$-GV2-GV3+(V2-V3)pC2+(V1-V3)pC3=0 \quad (2)$$

where $p=o+jw$ is the complex frequency, in which o is the attenuation and w is the angular frequency.

From the above equations it follows that the transfer function of the all-pass network is:

$$\frac{V3}{V1} = \frac{G^2 - pG(C1+C2) + p^2(C1 \cdot C2 + C1 \cdot C3 + C2 \cdot C3)}{G^2 + pG(C1+C2) + p^2(C1 \cdot C2 + C1 \cdot C3 + C2 \cdot C3)} \quad (3)$$

From this equation it is easy to derive that the gain of the network is unity for all frequencies. The phase shift of the network as a function of the frequency can also be derived from the above equation, which enables the delay function, i.e. the delay time as a function of the frequency, to be computed. For a second-order delay network the polynomials in p in the numerator and the denominator of equation (3) are of the second degree, enabling a resonant frequency $W_o$ and a quality factor Q to be defined. As is known, the transfer function of a second-order all-pass network, expressed in these quantities, may be written as:

$$\frac{V3}{V1} = \frac{1 - Q\left(\frac{p}{W_o} + \frac{W_o}{p}\right)}{1 + Q\left(\frac{p}{W_o} + \frac{W_o}{p}\right)} \quad (4)$$

It follows from equations (3) and (4) that:

$$W_o = \frac{G}{Q(C1 + C2)} \text{ and } Q^2 = \frac{C3}{C1 + C2} + \frac{C1 \cdot C2}{(C1 + C2)^2} \quad (5)$$

In a network comprising one second-order section the resonant frequency $W_o$ and the quality factor Q may be selected, for example, in such a way that the delay function is as flat as possible or that the delay time for all the frequencies within the bandwidth of the signal to be delayed equals the desired delay time as closely as possible.

When a chain of such networks is integrated it is important to minimized the overall capacitance of a network in view of the required chip area. From the equation for the resonant frequency it follows that for a given transconductance G the sum of the capacitances C1+C2 is defined by the selected resonant frequency $W_0$ and the quality factor Q. From the equation for the quality factor Q it follows that the capacitance C3 is minimal if C1=C2. When it is assumed that C1=C2=C/2, it follows from the foregoing that $$C = \frac{G}{W_o Q}, C1 = C2 = C/2 \text{ and } C3 = C(Q^2 - \tfrac{1}{4}) \quad (6)$$

As a result of the above choice the overall capacitance of a network is minimize, while at the same time it is found that resonance effects are minimize owing to the choice C1=C2.

Figure 3A:
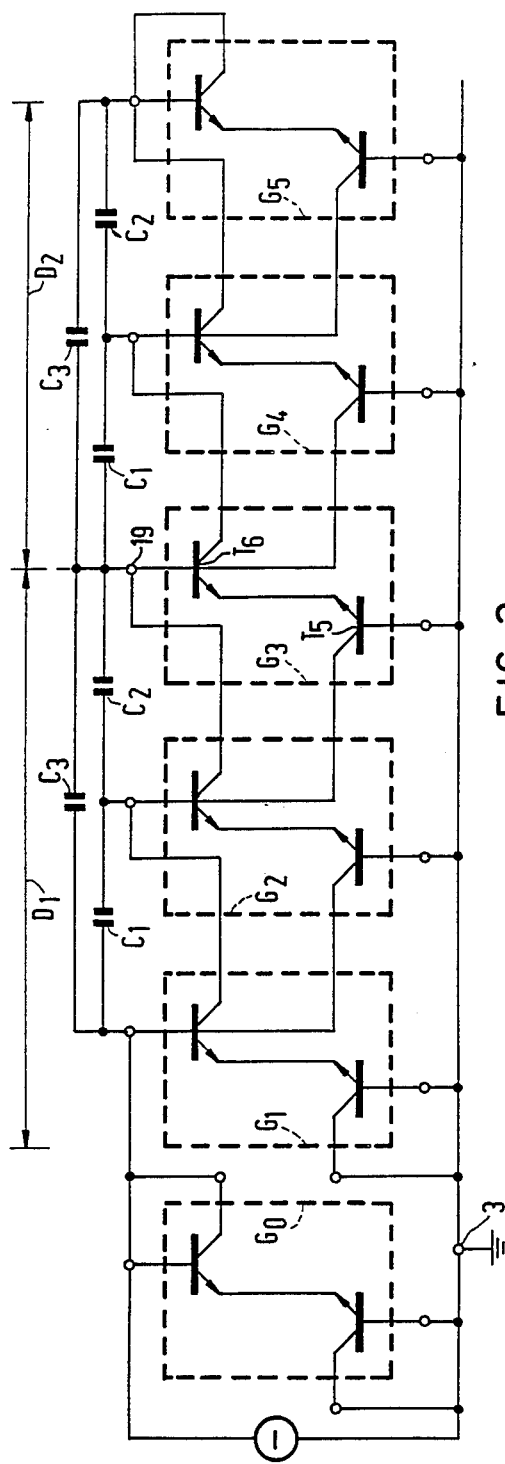
Figure 3B:
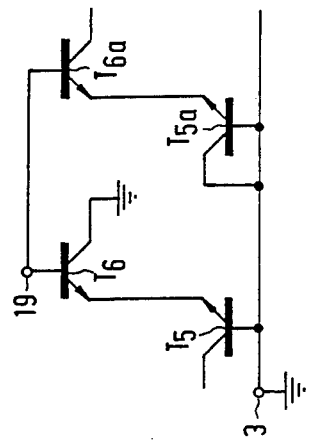

FIG. 3a shows a delay circuit comprising two second-order all-pass networks, in which identical parts bear the same reference numerals as in FIG. 2. It is to be noted that in reality the filter circuit may comprise several tens of networks. The second network $D_2$ is constructed in the same way as the network $D_1$ and comprises three transconductors $G_3$, $G_4$ and $G_5$. The transconductor $G_3$ is a transconductor which is common to the network $D_1$. This will be explained with reference to FIG. 3b, in which if the first network $D_1$ and the second network $D_2$ each comprise three transconductors the last transconductor $G_3$ is shown to comprise transistors $T_5$ and $T_6$ of the network $D_1$ and the first transconductor $G_{3a}$ is shown to comprise the transistors $T_{3a}$ and $T_{6a}$. The collectors of the transistors $T_6$ and $T_{5a}$ are connected to the ground terminal 3. Therefore, the collector currents of these transistors are not used for any further purpose in this circuit. These collector currents are equal, because the two transconductors have equal transconductances and the voltage across the two transconductors is the same. Therefore, the operation of the circuit does not change if the transistor $T_{6a}$ supplies current to the transistor $T_5$ and the transistors $T_6$ and $T_{5a}$ are dispensed with. The last transconductor $G_5$ of the network $D_2$ is loaded by a resistance in the same way as the transconductor $G_3$ in FIG. 2a. The circuit of FIG. 3a is driven by a signal-current source I across which a source resistance $R_o$ is connected. This resistance is constituted by a transconductor $G_o$ whose outputs are connected to its inputs. In order to minimize the effect of, for example, tolerances the transconductance of this transconductor $G_o$ is suitably the same as that of the transconductors in the networks $D_1$ and $D_2$. It is to be noted that the delay circuit may also be driven by a signal-voltage source, in which case the resistance $R_o$ should be connected in series with the voltage source. For example, in the above manner a delay line has been realized to delay video signals with a bandwidth of 0-5 MHz and a delay of 0.1 $\mu$s for each all-pass network, the maximum deviation from the desired delay being 9.7%. The resonant frequency and the quality factor of each network were equal to $W_o=4.98$ MHz and Q=0.702 respectively, the capacitance of the capacitors C1, C2 and C3 being equal to C1=C2=22.762 pF and C3=11.054 pF for a transconductance G=1 kOhm$^{-1}$ of the transconductors of the network.

In the circuit shown in FIG. 3a each all-pass network comprises one second-order filter section, such a section in the present example being designed to provide a delay which is as constant as possible over the desired bandwith. However, it is also possible to construct each all-pass network from a plurality of, for example, two, second-order filter sections which within a specific frequency range each have a delay with a comparatively strong frequency-dependence and which in combination provide a substantially constant delay over the desired bandwidth. For example, in this way a delay line has been realized in which the networks were each constructed from two cascaded second-order filter sections. FIG. 3a shows one all-pass network for this case. The networks had a delay of 0.2 $\mu$s over a bandwidth of 0-5 MHz, the maximum deviation being 0.73%. The first second-order filter section, reckoned from the input of the delay line, had a resonant frequency $f_1=3.72$ MHz and a quality factor $Q_1=0.569$ and the capacitances of the capacitors were equal to C1=C2=37.595 pF and C3=5.546 pF, while the second-order filter section had a resonant frequency $f_2=5.81$ MHz and a quality factor $Q_2=1.129$ and the capacitors had capacitances equal to C1=C2=12.132 pF and C3=24.861 pF. The transconductance of the transconductors of both the first section and the second section was G=1 kOhm$^{-1}$.

Figure 4:
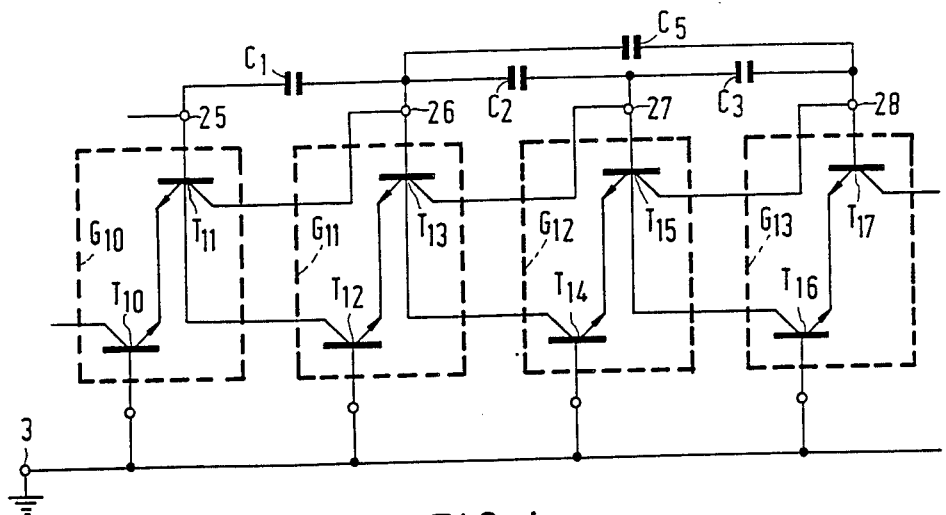

FIG. 4 shows an all-pass network for a delay circuit in accordance with the invention comprising a third-order filter section. This third-order filter section comprises a first-order filter section $D_1$ and a second-order filter section $D_2$. The first-order section $D_1$ comprises a transconductor $G_{10}$ comprising the transistors $T_{10}$ and $T_{11}$ and a capacitor $C_1$, and a transconductor $G_{11}$ which it has in common with the second-order section $D_2$. The second-order section $D_2$ is identical to that shown in FIG. 2 and comprises three transconductors $G_{11}$ comprising transistors $T_{12}$, $T_{13}$, $G_{12}$ comprising the transistors $T_{14}$, $T_{15}$ and $G_{13}$ comprising the transistors $T_{16}$, $T_{17}$, and three capacitors $C_2$, $C_3$ and $C_5$. By means of such a third-order all-pass network it is possible to obtain a delay which is equal to the desired delay over the entire bandwidth with an accuracy higher than in the case of a second-order all-pass network. For example, networks have been realized which exhibit a delay of 0.1 $\mu$s over a bandwidth of 0-5 MHz with a maximum deviation of 0.22%. The pole frequency of the first-order section was $f_1=6.40$ MHz and the first capacitor had a capacitance of $C_1=24.868$ pF, while the resonant frequency and the quality factor of the second-order section were $f_2=8.10$ MHz and $Q_2=0.779$ respectively, the capacitances of the capacitors being $C2=C3=12.611$ pF and $C5=9.001$ pF. The transconductors $G_{10}$ to $G_{13}$ inclusive again had transconductances equal to $G=1$ kOhm$^{-1}$.

Figure 5:
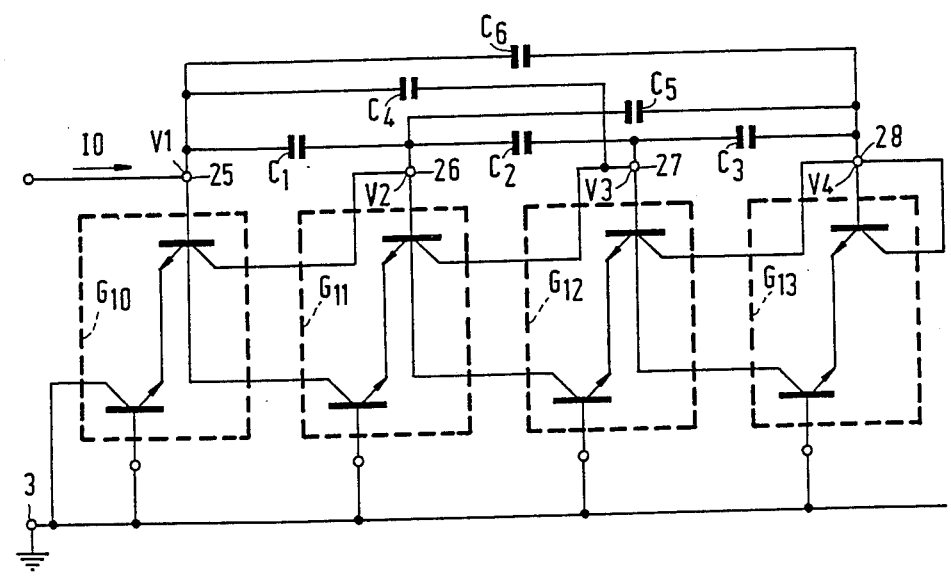
FIG. 5 shows a delay circuit in accordance with the invention comprising an improved third-order all-pass network of the first type.

In this third-order all-pass network the tendency to resonate as a result of stray capacitances can be reduced further by means of two additional capacitors, as is shown in FIG. 5. In this Figure a capacitor C4 is arranged between the inputs 25 and 27 of the transconductors $G_{10}$ and $G_{12}$ and a capacitor C6 between the inputs 25 and 28 of the transconductors $G_{10}$ and $G_{13}$. It is to be noted that said capacitor C6 may be dispensed with. The transfer function of this network can be derived by applying an input voltage $V_1$, which, in the same way as in the network shown in FIG. 3a, results in an input current IO which is drained to terminal 3 via the first output of the first transconductor $G_{10}$. If the voltages on the inputs 26, 27 and 28 are V2, V3, and V4 and the base currents of the transistors of the transconductors are ignored, the following equations may be drawn up for the currents through the inputs 26, 27 and 28:

$$-GV1+GV3+(V1-V2)pC1+(V3-V2)pC2+(V4-V2)pC5=0 \quad (7)$$

$$-GV2+GV4+(V1-V3)pC4+(V2-V3)pC2+(V4-V3)pC3=0 \quad (8)$$

$$-GV3-GV4+(V1-V4)pC6+(V2-V4)pC5+(V3-V4)pC3=0 \quad (9)$$

From the above equations it follows that the transfer function of the all-pass network is:

$$\frac{V4}{V1} = \frac{G^3 - pAG^2 + p^2BG - p^3D}{G^3 + pAG^2 + p^2BG + p^3D} \quad (10)$$

where $A = C1 + C2 + C3 + C6$ $B = C1 \cdot C2 + C1 \cdot C3 + C1 \cdot C4 + C2 \cdot C3 +$
$\quad C2 \cdot C4 + C2 \cdot C5 + C3 \cdot C5 + C4 \cdot C5$ $D = C1 \cdot C2 \cdot C3 + C1 \cdot C2 \cdot C5 + C1 \cdot C3 \cdot C4 +$
$\quad C1 \cdot C3 \cdot C5 + C1 \cdot C4 \cdot C5 + C2 \cdot C3 \cdot C4 +$
$\quad C2 \cdot C4 \cdot C5 + C3 \cdot C4 \cdot C5 + BC6.$ From this equation it is evident that the gain of the network is equal to unity for all frequencies. In view of integration it is again important to minimize the overall capacitance of the network. Minimizing the overall capacitance can now be effected only numerically. In this way the following capacitance values have been found for a delay line for a video signal having a bandwidth of 0–5 MHz and a delay of 0.1 μs per network for a transconductance $G=1$ kOhm$^{-1}$ of the transconductors:

$C1=C2=C3=16.246$ pF $C4=C5=3.247$ pF $C6=1.354$ pF.

Figure 6A:
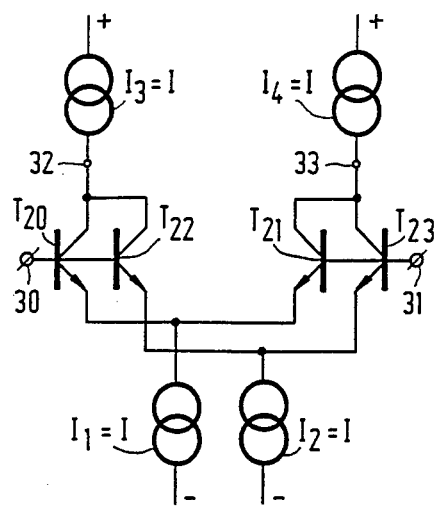
FIG. 6 shows some transconductors for use in delay circuits in accordance with the invention.

In the above examples the transconductors are always represented as simple differential amplifiers. In order to enable comparatively high input voltages to be handled the transconductance should be constant over a maximum voltage range. In a simple differential amplifier the output current increases as a linear function of the input voltage over a small range only, so that the transconductance is only constant over a small range of input voltages. Therefore, linearized differential amplifiers are generally used as transconductors. An example of such a transconductor is shown in FIG. 6a. The transconductor comprises two differential amplifiers arranged in parallel. The first differential amplifier comprises the transistors $T_{20}$ and $T_{21}$, which transistors have unequal emitter areas. A current source $I_1=I$ is arranged in the common emitter line of these transistors. The second differential amplifier comprises the transistors $T_{22}$ and $T_{23}$, which also have unequal emitter areas. The ratio between the emitter areas of the transistors $T_{20}$ and $T_{21}$ is equal to that of the transistors $T_{23}$ and $T_{22}$. In the common emitter line of the transistors $T_{22}$ and $T_{23}$ a current source $I_2=I$ is arranged. The commoned bases of the transistors $T_{23}$ and $T_{22}$ constitute a first input 30 and the commoned bases of the transistors $T_{21}$, $T_{23}$ constitute a second input 31 of the transconductor. The collectors of the transistors $T_{20}$ and $T_{22}$ are connected to a first output 32 and the collectors of the transistors $T_{21}$ and $T_{23}$ are connected to a second output 33. The outputs 32 and 33 are loaded by a current source $I_3=I$ and $I_4=I$ respectively. If the ratio between the emitter areas of the transistors $T_{20}$ and $T_{21}$ is 4 the transconductance, which is equal to the ratio between the signal current on the outputs 32 and 33 and the signal voltage across the inputs 30 and 31, is given by $$G = \frac{8}{25} \cdot \frac{qI}{kT}.$$

The linear range of such a differential amplifier is approximately 5 times as large as that of a single differential amplifier. From the equation for the transconductance it also follows that this transconductance can be varied by varying the quiescent current I. The delay of the network can be varied by varying this current for all the transconductors in a delay circuit.

Figure 6B:
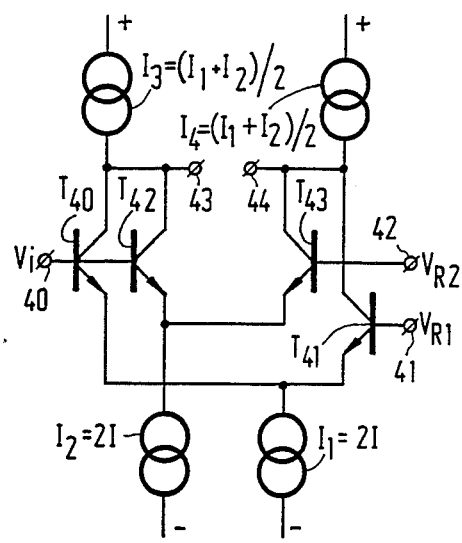

FIG. 6b shows a second example of a linearized transconductor. It comprises a first differential amplifier comprising the transistors T40 and T41, in whose common emitter line a current source $I_1=2I$ is arranged, and a second differential amplifier comprising the transistors T42 and T43 in whose common emitter line a current source $I_2=2I$ is arranged. The bases of the transistors T40 and T42 are connected to an input 40, to which the input voltage $V_{in}$ is applied. The base of the transistor T41 is connected to a terminal 41 to which a reference voltage $V_{R1}$ is applied and the base of the transistor T43 is connected to a terminal 42 to which a reference voltage $V_{R2}$ is applied. The collectors of the transistors T40, T42 are connected to a first output 43, which is loaded by a current source $I_3=(I_1+I_2)/2$ and the collectors of the transistors T41, T43 are connected to a second input 44, which is loaded by a current source $I_4=(I_1+I_2)/2$ the reference voltages $V_{R1}$ and $V_{R2}$ are symmetrical about a voltage level $V_{RO}$ of the filter-ground. By a suitable choice of these voltages it is possible to achieve that the output current increases as a linear function of the input voltage over a wider range than attainable with a single differential amplifier.

Figure 6C:
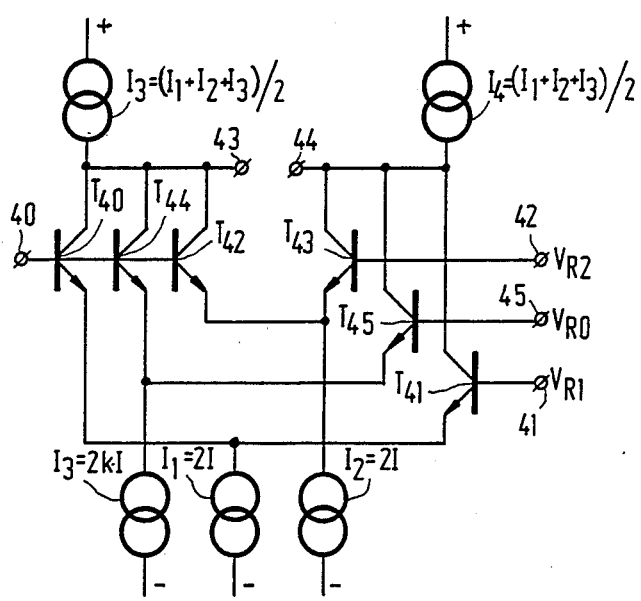

This linear range can be extended further if, as is illustrated in FIG. 6c, a third differential amplifier comprising the transistors T44 and T45 is added to the circuit, a current source $I_3 = k.2I$ ($k<1$) being arranged in the common emitter line of these transistors. The base and the collector of the transistor T44 are connected to the input 40 and to the output 43, respectively. The base of the transistor T45 is connected to a terminal 45, to which a reference voltage $V_{RO}$ is applied. The collector of the transistor T45 is connected to the output 44. In the case of a suitable choice of the voltages $V_{R1}$ and $V_{R2}$, which are again symmetrical about the value $V_{RO}$, and of the ratio between the currents of the current sources $I_1$, $I_2$ and $I_3$, a comparatively wide range of constant transconductance is obtained. The linear range of the transconductor can be further extended by adding further differential amplifiers to the circuit.

Figure 7:
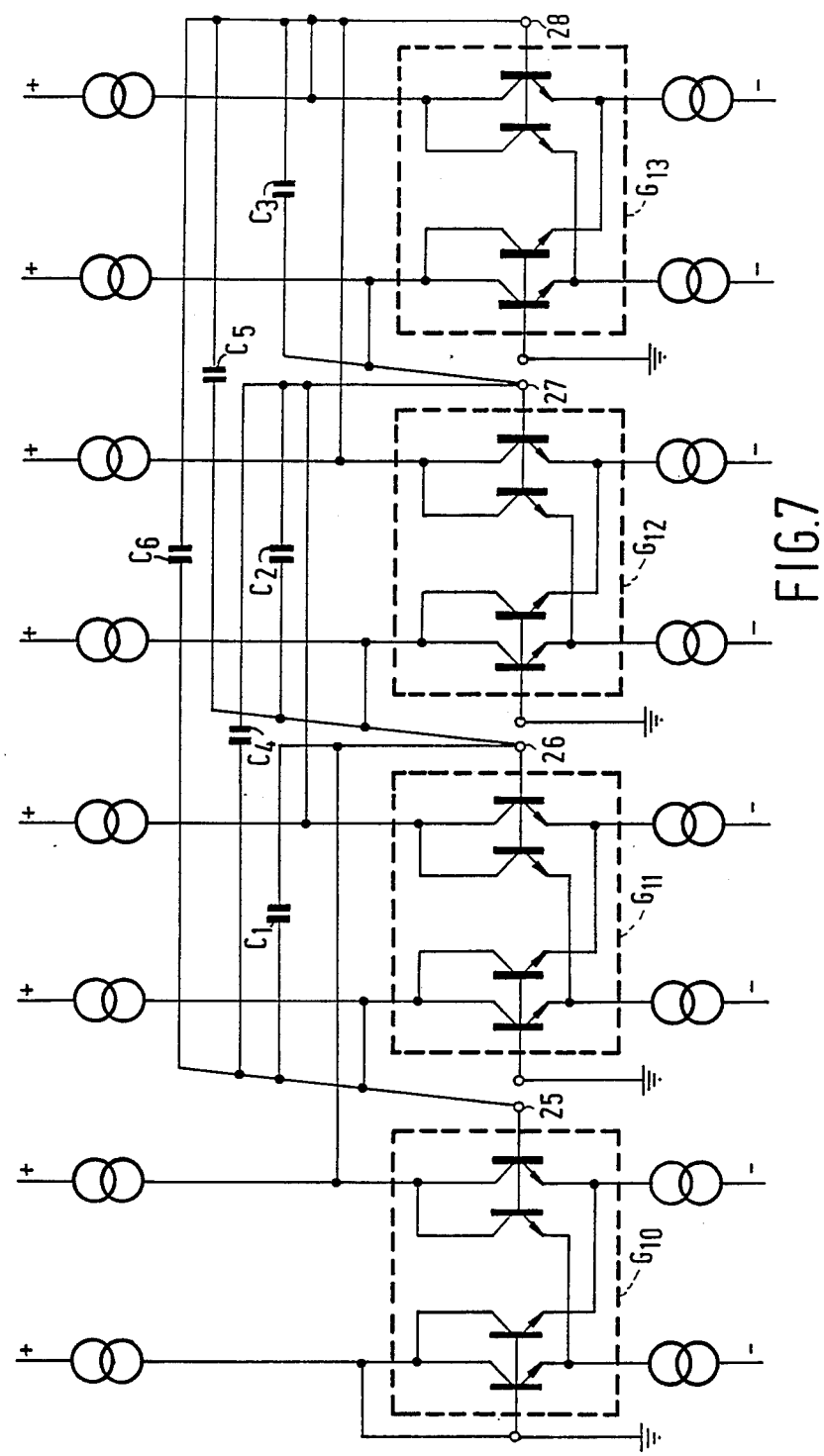
FIG. 7 shows the circuit of FIG. 5 comprising transconductors as shown in FIG. 6, FIGS. 8a, b and c show diagrams to analyze the operation of the circuit shown in FIG. 2a, FIG. 8d shows a delay circuit in accordance with the invention comprising an all-pass network of a second type.

In FIG. 7 the network of FIG. 5 comprises transconductors of the type shown in FIG. 6. It is to be noted that the invention is not limited to the transconductor shown but that it is alternatively possible to utilize other transconductors such as those described in the previously-filed U.S. patent application Ser. No. 015,452.

Figure 8A:
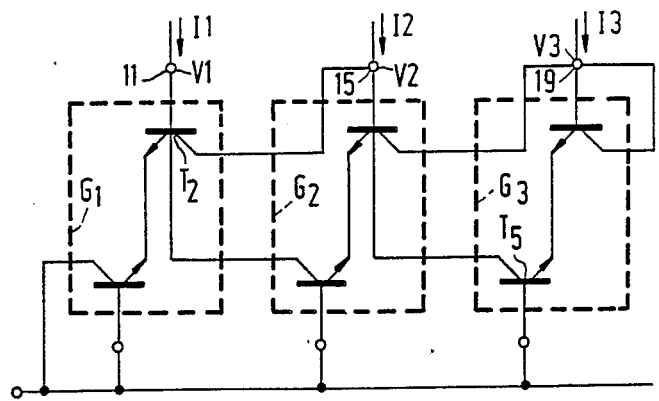

FIG. 8a again shows the circuit of FIG. 2a, the capacitors being omitted for the sake of clarity. The current I2 applied to the junction point 15 is equal to the difference between the collector currents of the transistors $T_2$ and $T_5$. This means that this current complies with:

$$I2 = GV1 - GV3 = G(V1 - V3) \quad (11)$$

Figure 8B:
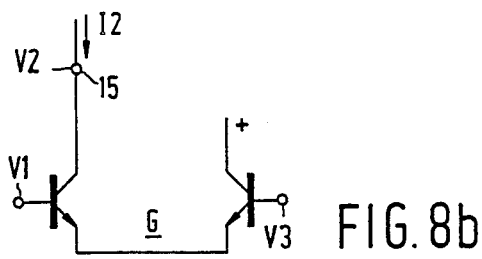

An analysis of this equation reveals that the same current I2 can also be obtained by applying a voltage V3−V1 across a transconductor having a transconductance G, as is indicated in FIG. 8b. In the present case the transconductor does not comprise a grounded input as in the case of the transconductor shown in FIG. 8a and further it comprises one instead of two outputs from which the signal current can taken. The other output is connected to ground. The following equations are valid for the currents through the junction points 11 and 19:

$$I1 = -GV2 = G(0-V2)$$

$$I3 = GV2 + GV3 = G(V2-0) + G(V3-o) \quad (12)$$

Figure 8C:
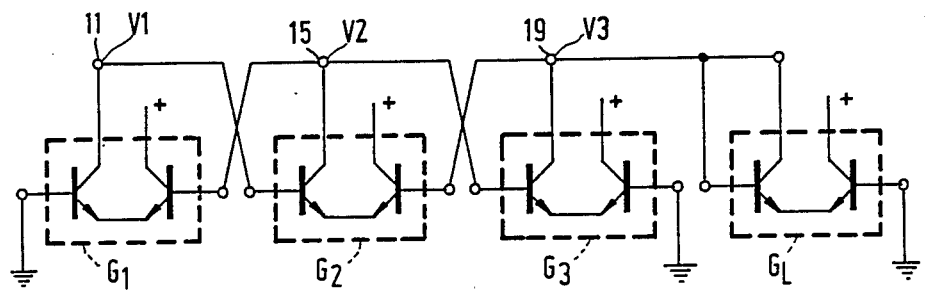
Figure 8D:
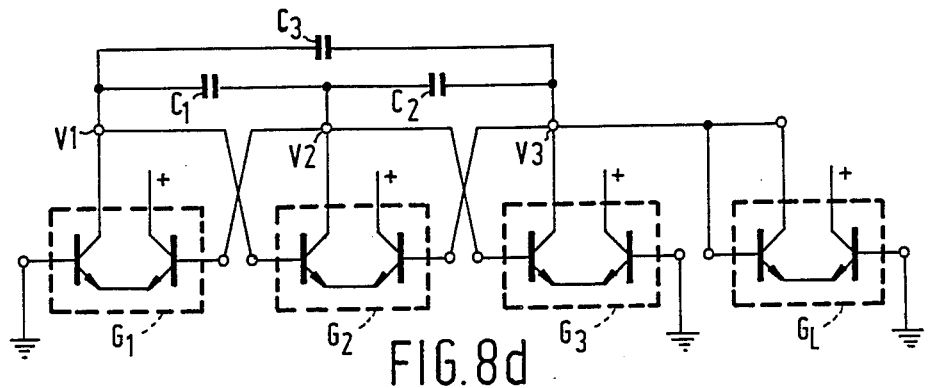

Thus, these currents can be obtained by applying the relevant voltages across transconductors. The circuit of FIG. 8a modified in accordance with this principle is shown in FIG. 8c, $G_L$ being the transconductor constituting the load resistance. FIG. 8b shows the complete second-order all-pass network. Further this circuit operates in the same way as that shown in FIG. 2.

Figure 9A:
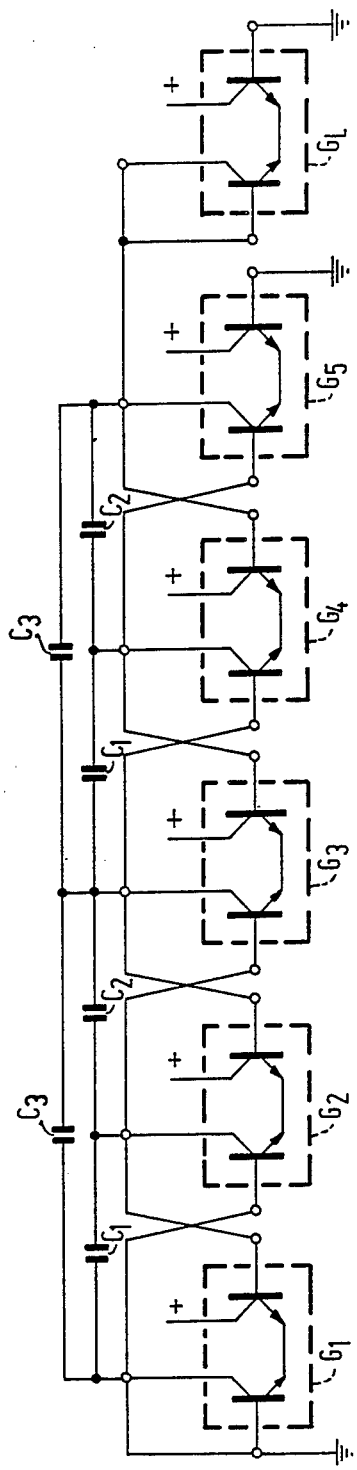
FIG. 9a shows a delay circuit in accordance with the invention comprising two cascaded second-order networks as shown in FIG. 8d.
Figure 9B:
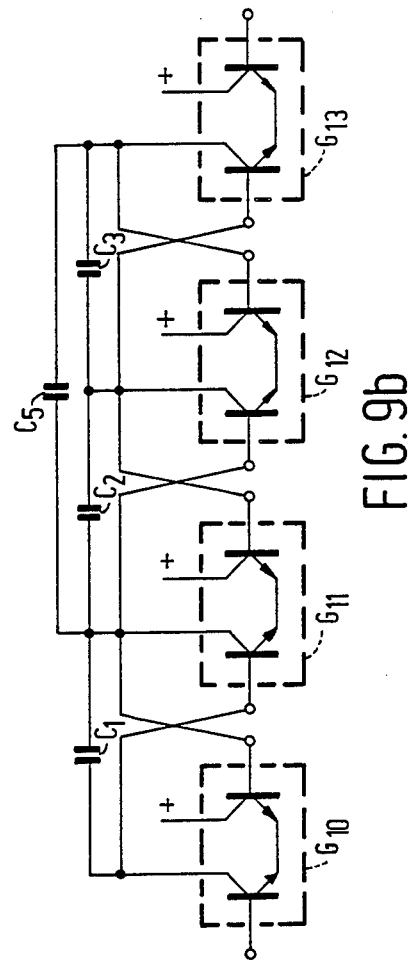
FIG. 9b shows a delay circuit in accordance with the invention comprising a third-order all-pass network of a second type.

FIGS. 9a, b and c show the circuits of FIGS. 3, 4 and 5 in similarly modified form. It is to be noted that also for this type of transconductor cascading of identical networks enables one common transconductor to be obtained, so that one transconductor can be saved. In the circuits shown in FIGS. 8 and 9 signal current is taken from only one output of the transconductor. The other output is not used and the signal current which is in principle available on this output is drained to a supply-voltage terminal. However, the output signal current of the transconductor may be increased by adding the signal current from the non-used output to the output signal current. In principle, this can be achieved by means of a current mirror. FIG. 10a shows the transconductor of FIG. 6 provided with a current mirror comprising a diode-connected PNP transistor T30 and a PNP transistor T31. However, the use of PNP transistors is less desirable because they have an adverse effect on the high-frequency behavior of the circuit. FIG. 10b illustrates a solution which is more favorable in this respect. Here, the transconductor is loaded by a negative immittance converter comprising an operational amplifier 30 having an inverting input (−) connected to the junction point 33, a non-inverting input (+) connected to the junction point 32, and an output 34 connected to the inverting input via a resistor $R1 = R$ and to the non-inverting input via a resistor $R2 = R$. The junction point 32 is connected to the output 35 of the transconductor. The signal currents through the junction point 33 and the junction point 32 are in phase opposition. The immittance converter converts the signal current through the junction point 33 and adds this current to the signal current through the junction point 32, so that the output signal current is doubled. This is because the operational amplifier 30 ensures that the voltage on the inverting input is equal to that on the non-inverting input. As the resistors $R_1$ and $R_2$ are equal, the currents through these resistors are equal. The current through the junction point 33 flows through the resistor $R_2$, so that the same current also flows through the resistor $R_1$.

Figure 11A:
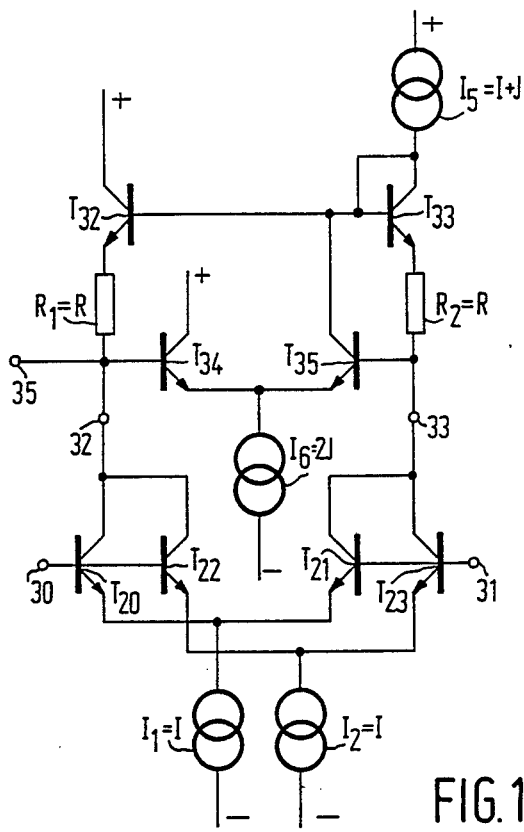
FIG. 11a shows a first elaborated version of the circuit shown in FIG. 10b.

FIG. 11 shows two examples of such a transconductor comprising a negative immittance converter. In FIG. 11a the junction point 33 between the collectors $T_{21}$ and $T_{23}$ is connected to the positive power-supply terminal by means of the series arrangement of the resistor $R_2$, a diode-connected transistor $T_{33}$, and a current source $I_5 = I + J$, and the junction point 32 between the collectors of the transistors $T_{20}$ and $T_{22}$ is connected to the positive power-supply terminal by means of the series arrangement of the resistor $R_1$ and the collector-emitter path of a transistor $T_{32}$ having its base connected to the base of the transistor $T_{33}$. Further, the junction points 32 and 33 are connected to the bases of two transistors $T_{34}$ and $T_{35}$ arranged as a differential amplifier, whose common emitter terminal is connected to the negative power-supply terminal via a current source $I_6 = 2J$. The collector of the transistor $T_{35}$ is connected to the base of the transistor $T_{32}$ and the collector of the transistor $T_{34}$ is connected to the positive power-supply terminal.

Figure 10A:
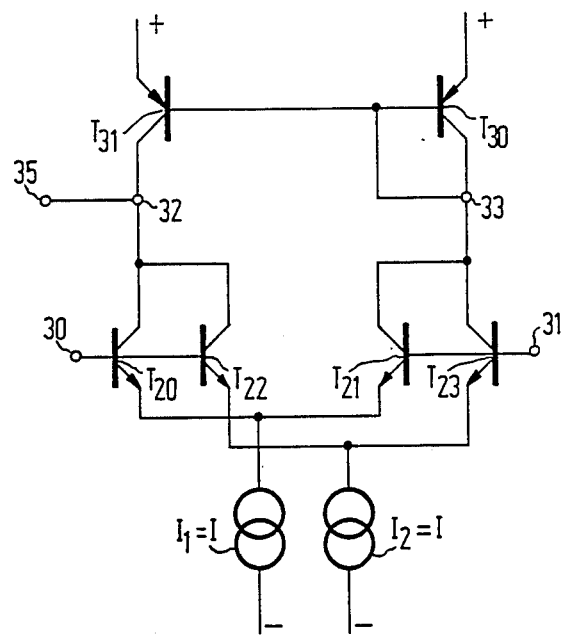
FIG. 10a shows a transconductor of a first type for use in the delay circuits of FIG. 8d and FIG. 9.
Figure 10B:
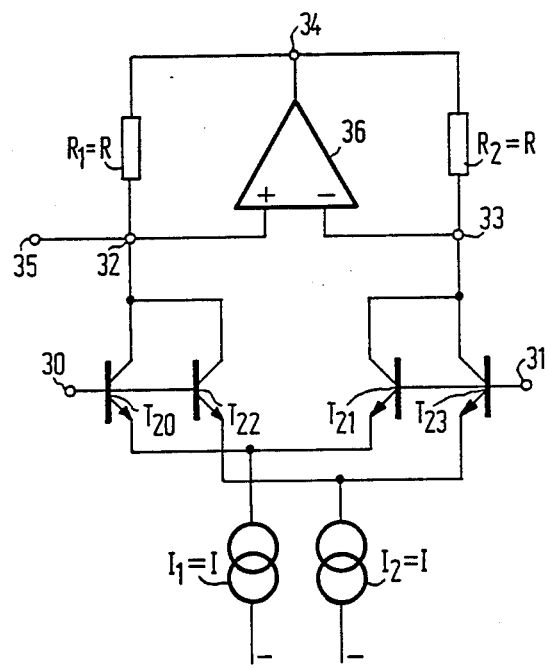
FIG. 10b shows a transconductor of a second type for use in the delay circuit shown in FIG. 8d and FIG. 9.
Figure 11B:
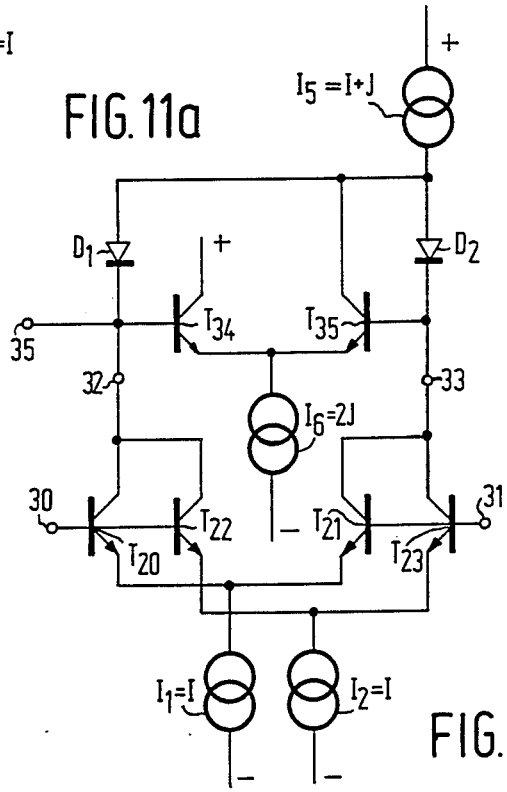
FIG. 11b shows a second elaborated version of the circuit shown in FIG. 10b.

Instead of the resistors $R_1$ and $R_2$ and the transistors $T_{32}$ and $T_{33}$ the circuit shown in FIG. 11b comprises two diodes $D_1$ and $D_2$ arranged respectively between the output and the non-inverting input 32 and between the output and the inverting input 33 of the differential amplifier $T_{34}$, $T_{35}$. The operation of the circuits shown in FIGS. 11a and b is the same as that of the circuit shown in FIG. 10b.

Figure 9C:
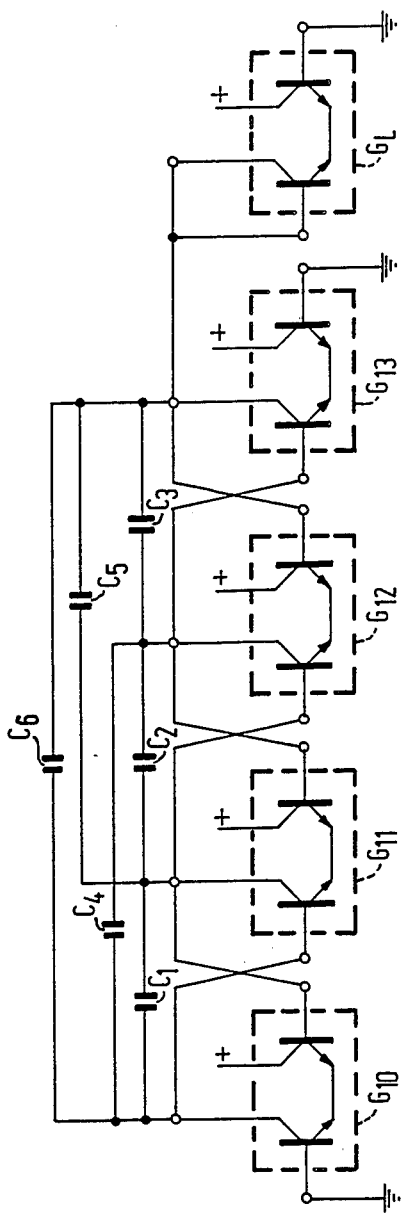
FIG. 9c shows a delay circuit in accordance with the invention comprising an improved third-order network of the second type.
Figure 12:
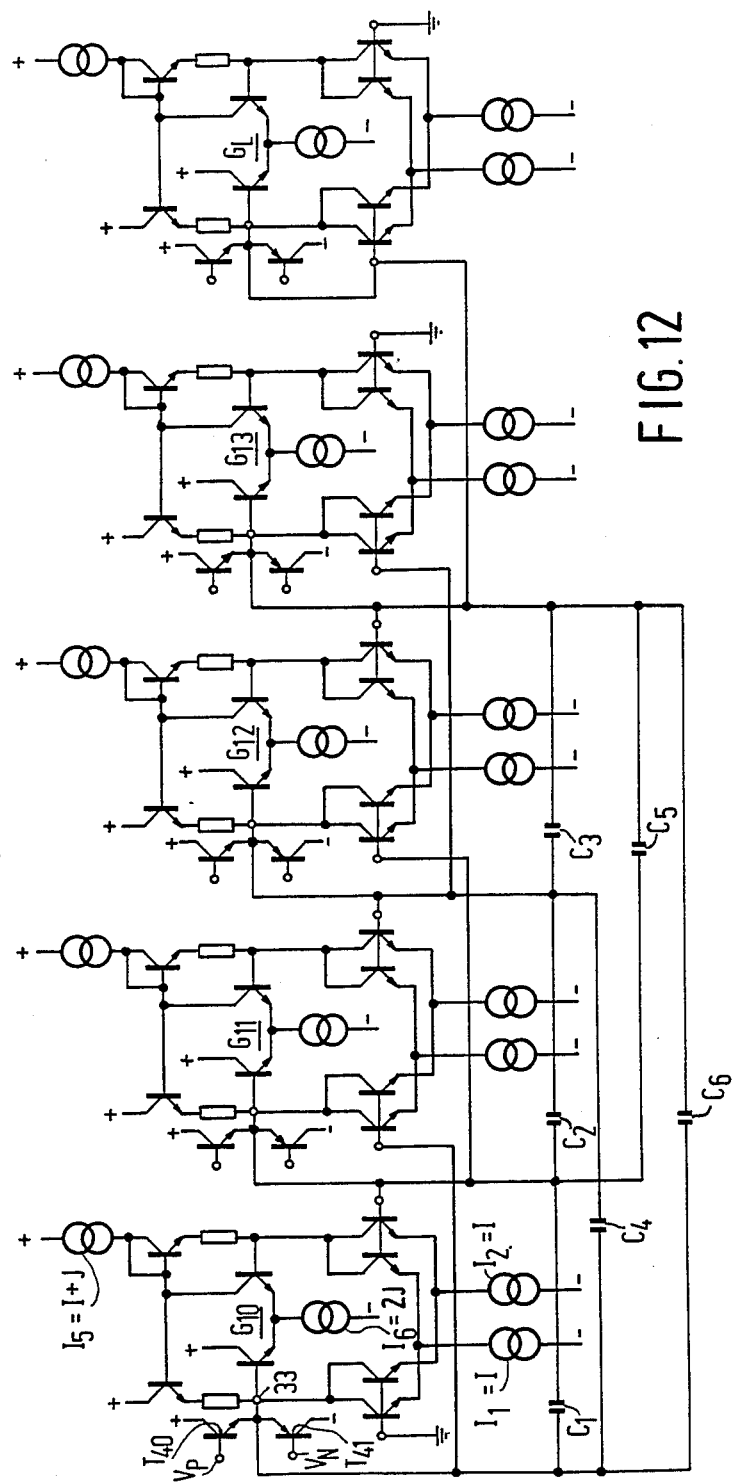

Finally, FIG. 12 shows the detailed circuit diagram of a third-order all-pass network as shown in FIG. 9c provided with transconductors as shown in FIG. 11a. Here, the outputs of the transconductors $G_{10}$ to $G_{13}$ and $G_L$ are moreover clamped at a voltage of 0 V by means of a clamping circuit comprising a NPN transistor $T_{40}$ whose emitter is connected to the output 33 of the relevant transconductor, whose collector is connected to the positive power-supply terminal, and whose base is connected to the terminal carrying the positive reference voltage $V_P$, and a PNP transistor $T_{41}$ having its emitter connected to the output 33, having its collector connected to the negative power-supply terminal, and having its base connected to a terminal carrying a negative reference voltage $V_N$. The reference voltages are, for example, $V_P = 2\ D/3$, $V_N = -2\ D/3$, D being a diode voltage. When the requirement is met that the current J from the current source $I_6$ of the negative immittance converter is larger than the current I from the currents sources $I_1$ and $I_2$ of the transconductor, this voltage clamping ensures that after switching on of the power supply the circuit operates in the desired manner and that "latch-up" is not possible.

The invention is not limited to the embodiments shown. It will be evident that within the scope of the invention many variants are conceivable to those skilled in the art. For example, the construction of the transconductors is not relevant to the invention, so that these transconductors may be constructed in various manners.

What is claimed is

1. A delay circuit comprising at least one all-pass network which has an input terminal for receiving an input signal, an output terminal for supplying an output signal, and a reference terminal for carrying a reference potential and which comprises an at least second-order filter section comprising first, second and third transconductors, which each have a first input, a second input, a first output and a second output, the first input of each of the three transconductors being coupled to the reference terminal, the second input of the first transconductor being coupled to the input terminal, the second input of the second transconductor being coupled to the second output of the first transconductor and to the first output of the third transconductor, the second input of the third transconductor being coupled to the second output of the second transconductor and to the output terminal, said filter section further comprising a first capacitor coupled between the second inputs of the first transconductor and the second transconductor and a second capacitor coupled between the second inputs of the first transconductor and the third transconductor, wherein the filter section further comprises a third capacitor coupled between the second inputs of the second transconductor and the third transconductor, each of the transconductors comprises a linearized differential amplifier comprising at least two emitter-coupled transistors with a bias-current source, the bases of the transistors constituting the first input and the second input and the collectors constituting the first output and the second output, and each of the transconductors comprises two differential amplifiers which are arranged in parallel and which each comprise two transistors having unequal emitter areas, the bases and the collectors of each pair of two transistors having unequal emitter areas being interconnected.

2. A delay circuit comprising at least one all-pass network having an input terminal for receiving an input signal, an output terminal for supplying an output signal, and a reference terminal for carrying a reference potential, and comprising an at least second-order filter section which comprises first, second and third transconductors, which each have a first input, a second input, a first output and a second output, and a first and a second capacitor, wherein the first input of the first transconductor is coupled to the input terminal, the first input of the second transconductor is coupled to the first output of the first transconductor, the first output of the second transconductor is coupled both to the second input of the first transconductor and to the first input of the third transconductor, and the second input of the second transconductor is coupled to the first output of the third transconductor, the first capacitor is coupled between the first output of the first transconductor and that of the second transconductor and the second capacitor is coupled between the first output of the first transconductor and that of the third transconductor, a third capacitor is coupled between the first output of the second transconductor and that of the third transconductor, each of the transconductors comprises a linearized differential amplifier comprising at least two emitter-coupled transistors with a bias current source, the bases of the transistors constituting the first input and the second input and the collectors constituting the first output and the second output, and each of the transconductors comprises two differential amplifiers which are arranged in parallel and which each comprise two transistors having unequal emitter areas, the bases and the collectors of each pair of two transistors having unequal emitter areas being interconnected.

3. A delay circuit comprising at least one all-pass network which has an input terminal for receiving an input signal, an output terminal for supplying an output signal, and a reference terminal for carrying a reference potential and which comprises an at least second-order filter section comprising first, second and third transconductors, which each have a first input, a second input, a first output and a second output, the first input of each of the three transconductors being coupled to the reference terminal, the second input of the first transconductor being coupled to the input terminal, the second input of the second transconductor being coupled to the second output of the first transconductor and to the first output of the third transconductor, the second input of the third transconductor being coupled to the second output of the second transconductor and to the output terminal, said filter section further comprising a first capacitor coupled between the second inputs of the first transconductor and the second transconductor and a second capacitor coupled between the second inputs of the first transconductor and the third transconductor, wherein the filter section further comprises a third capacitor coupled between the second inputs of the second transconductor and the third transconductor, each of the transconductors comprises a linearized differential amplifier comprising at least two emitter-coupled transistors with a bias-current source, the bases of the transistors constituting the first input and the second input and each of the transconductors comprises at least two differential amplifiers which each comprise two transistors having substantially equal emitter areas, the bases and the collectors of one of the transistors of each differential amplifier being interconnected, the bases of the other transistors of each differential amplifier receiving mutually different reference voltages, and the collectors of said other transistors being interconnected.

4. A delay circuit comprising at least one all-pass network having an input terminal for receiving an input signal, an output terminal for supplying an output signal, and a reference terminal for carrying a reference potential, and comprising an at least second-order filter section which comprises first, second and third transconductors, which each have a first input, a second input, a first output and a second output, and a first and a second capacitor, wherein the first input of the first transconductor is coupled to the input terminal, the first input of the second transconductor is coupled to the first output of the first transconductor, the first output of the second transconductor is coupled both to the second input of the first transconductor and to the first input of the third transconductor, and the second input of the second transconductor is coupled to the first output of the third transconductor, the first capacitor is coupled between the first output of the first transconductor and that of the second transconductor and the second capacitor is coupled between the first output of the first transconductor and that of the third transconductor, a third capacitor is coupled between the first output of the second transconductor and that of the third transconductor, each of the transconductors comprises a linearized differential amplifier comprising at least two emitter-coupled transistors with a bias current source, the bases of the transistors constituting the first input and the second input and the collectors constituting the first output and the second output, and each of the transconductors comprises at least two differential amplifiers which each comprise two transistors having substantially equal emitter areas, the bases and the collectors of one of the transistors of each differential amplifier being interconnected, the bases of the other transistors of each differential amplifier receiving mutually different reference voltages, and the collectors of said other transistors being interconnected.

* * * * *